United States Patent
Dosaka (10) Patent No.: US 6,628,560 B2
(45) Date of Patent: Sep. 30, 2003

(54) DYNAMIC SEMICONDUCTOR MEMORY DEVICE WITH ADJUSTABLE REFRESH FREQUENCY

(75) Inventor: Katsumi Dosaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/192,721

(22) Filed: Jul. 11, 2002

(65) Prior Publication Data

US 2003/0012070 A1 Jan. 16, 2003

(30) Foreign Application Priority Data

Jul. 13, 2001 (JP) ........................................ 2001-213472

(51) Int. Cl.[7] ................................................. G11C 7/00
(52) U.S. Cl. ................... 365/222; 365/236; 365/189.07
(58) Field of Search ............................... 365/222, 149, 365/236, 189.07

(56) References Cited

U.S. PATENT DOCUMENTS

| | | | |
|---|---|---|---|
| 5,453,959 A | * | 9/1995 | Sakuta et al. ................ 365/222 |
| 5,495,452 A | | 2/1996 | Cha |
| 5,652,729 A | * | 7/1997 | Iwata et al. .................. 365/149 |
| 2002/0181301 A1 | * | 12/2002 | Takahashi et al. .......... 365/200 |

FOREIGN PATENT DOCUMENTS

JP 7-73668 3/1995

* cited by examiner

*Primary Examiner*—Huan Hoang
(74) *Attorney, Agent, or Firm*—McDermott, Will & Emery (57) ABSTRACT

A self-refresh timer includes an N-bit counter counting a self-refresh signal, a comparator comparing an output from the counter with a preset value of N-bit width held by a preset value holding circuit, an adder for incrementing, by one, a preset value defined as an output cycle period of the self-refresh timer, and a selector circuit receiving an output from the adder and the preset value to output one of them according to an output from the comparator. An output from a source oscillator is divided according to the output from the selector circuit and thus the self-refresh signal is generated.

5 Claims, 8 Drawing Sheets

DYNAMIC SEMICONDUCTOR MEMORY DEVICE WITH ADJUSTABLE REFRESH FREQUENCY

BACKGROUND OF THE INVENTION

1. Field of the Invention

The present invention relates to dynamic semiconductor memory devices. In particular, the invention relates to a structure of a dynamic semiconductor memory device having a self-refresh function with controllable timing for starting a refresh operation within a chip of the semiconductor memory device.

2. Description of the Background Art

A dynamic random access memory (hereinafter referred to as DRAM) is structured with memory cells each storing information by the amount of charge accumulated on a capacitor. The charge accumulated on the capacitor is lost over time. Therefore, the lost charge should be compensated for by a periodic refreshing in the DRAM according to the information retained in the capacitor of the memory cell.

One refresh operation, namely so-called "self-refresh" operation is performed with controlled timing for starting refreshing of circuitry within a chip.

Then, a semiconductor memory device having such a self-refresh function needs a self-refresh timer for determining timing for starting refreshing. For a general DRAM, the self-refresh timer generates a pulse once per 16 $\mu$sec, for example. According to this pulse, a refresh operation is carried out.

Requirements to be satisfied by such a refresh timer are that:

1) power consumption is small enough to achieve reduction of supply current for retaining data;
2) oscillation frequency does not vary with respect to variations in supply voltage and temperature; and
3) oscillation frequency does not vary even if process parameters for example change, or post-tuning is possible.

The third requirement is particularly described in detail below.

The self-refresh timer for controlling the self-refresh operation as described above includes a transistor as its component having threshold voltage Vth, gate length and gate width for example which vary depending on process changes. A resultant problem is that the oscillation frequency itself of an oscillator of the timer could vary.

Then, in order to posteriorly adjust such variations of characteristics due to process parameters as described above, the oscillation frequency of the self-refresh timer is preferably tunable after a wafer process.

Figure 7:
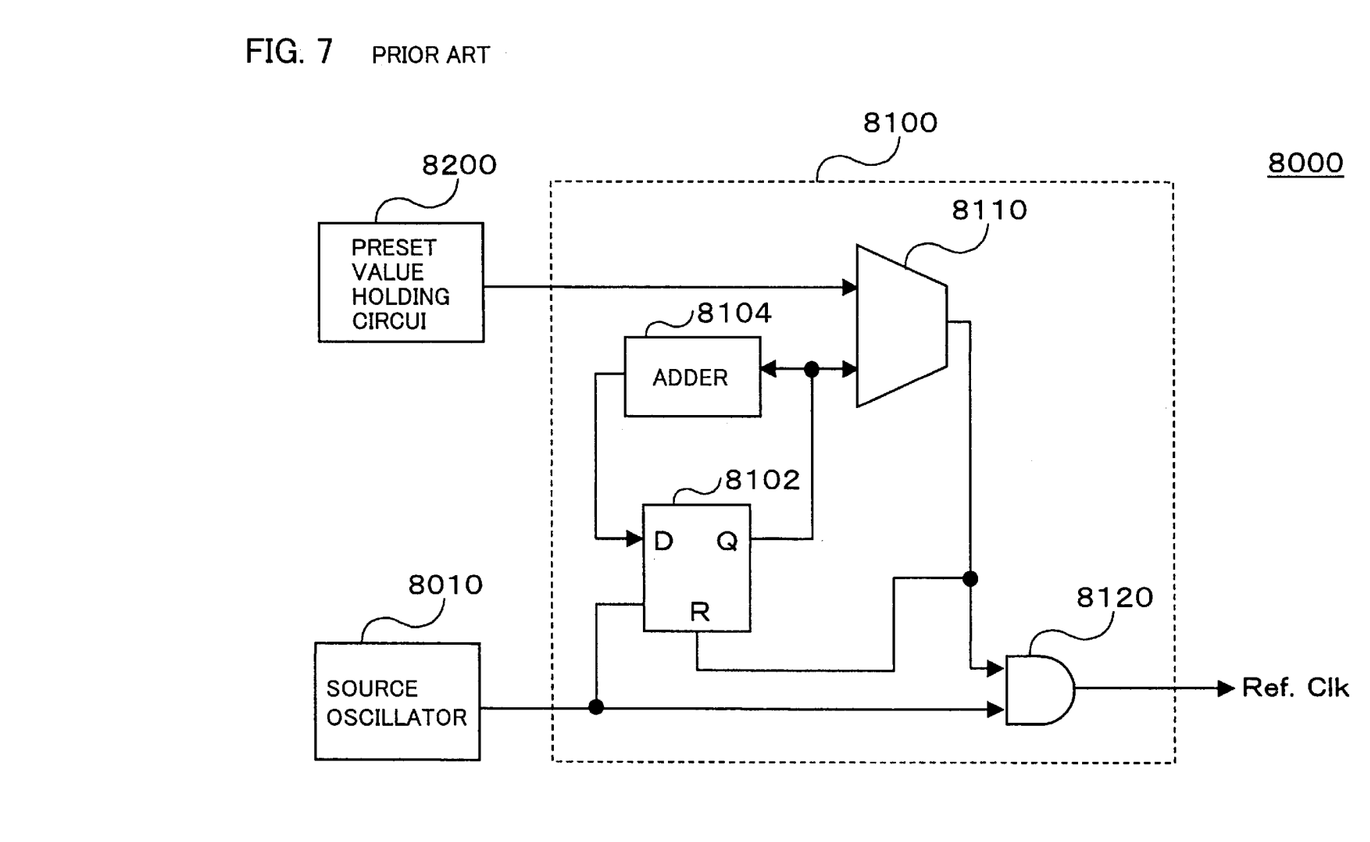
FIG. 7 is a schematic block diagram showing a structure of a conventional self-refresh timer 8000.

FIG. 7 is a schematic block diagram showing a structure of a conventional self-refresh timer 8000.

Self-refresh timer 8000 includes a source oscillator 8010 constituted of an inverter chain for example, a programmable counter 8100, and a preset holding circuit 8200 for holding a preset value used for tuning. The preset value is not limited to a specific value. For example, the preset value can be programmed after a wafer process by a fuse element, for example.

Source oscillator 8010 operates with a considerably long oscillation cycle period of several $\mu$sec for the purpose of reducing power consumption. An output frequency of this source oscillator 8010 is divided by programmable counter 8100 by an integral divisor so that pulse signal Ref.Clk is output for a self-refresh operation. The divisor used by programmable counter 8100 can posteriorly be adjusted to tune the cycle period of the output from self-refresh timer 8000.

Specifically, programmable counter 8100 includes a flip-flop circuit 8102 having its input node D receiving an input signal composed of multiple bits, the input signal being supplied to its output node Q according to activation of the output from source oscillator 8010, an adder 8104 receiving the output from flip-flop circuit 8102 to increment the output by one, a comparator 8110 having one input receiving the output from flip-flop circuit 8102 and the other input receiving from preset holding circuit 8200 a preset value which can externally be set and outputting a comparison result, and an AND circuit 8120 receiving the output from comparator 8110 and the output from source oscillator 8010 to output reference clock signal Ref.Clk used for a self-refresh operation. A reset command is issued, at a certain clock, to flip-flop circuit 8102 by the output from comparator 8110, and, at the following clock, the output from flip-flop circuit 8102 is reset.

Figure 8:
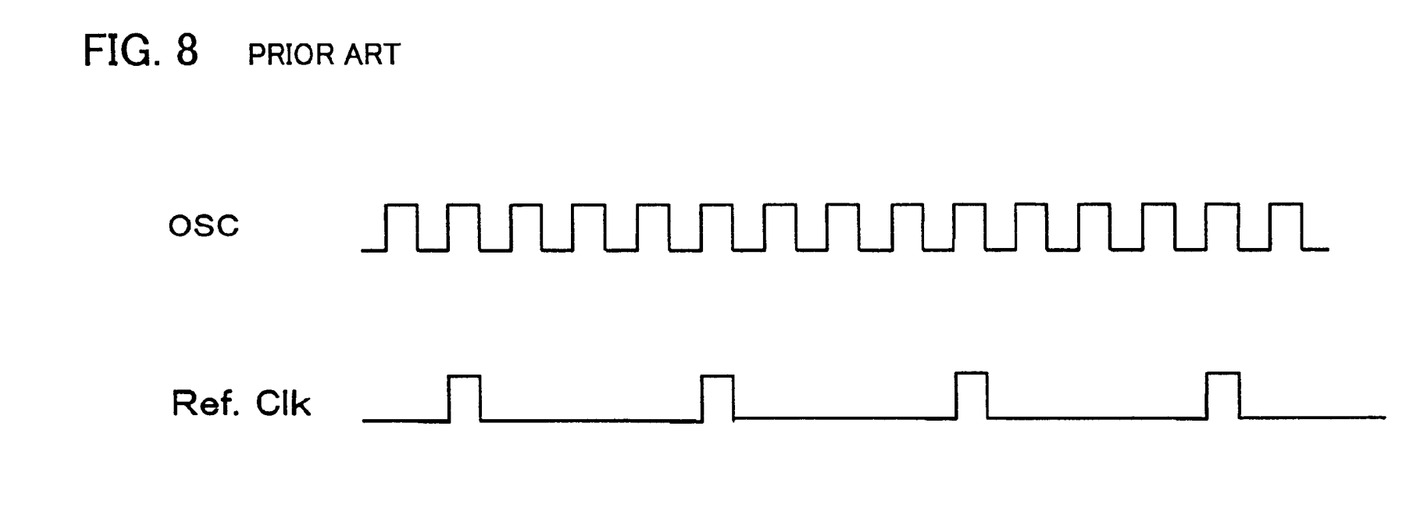
FIG. 8 is a timing chart illustrating an operation of self-refresh timer 8000 shown in FIG. 7.

FIG. 8 is a timing chart illustrating an operation of self-refresh timer 8000 shown in FIG. 7.

It is supposed here that the preset value is 4 for describing the operation by using FIG. 8. Referring to FIG. 8, OSC represents an output from source oscillator 8010. The number of times output OSC is activated is added by flip-flop circuit 8102 and adder 8104. When flip-flop circuit 8102 outputs 4, comparator 8110 has its output level of "H" level (logical high level, hereinafter H level). Accordingly, reference clock Ref.Clk is supplied from AND circuit 8120.

At the following clock of source oscillator 8010, the output from flip-flop circuit 8102 is reset and thus the output from comparator 8110 is also reset. Then, AND circuit 8120 has its output level of "L" level (logical low level, hereinafter L level).

Through this operation, a signal is output from AND circuit 8120, the output signal having a value determined by dividing the oscillation frequency of source oscillator 8010 by the preset value.

For example, suppose that a designed oscillation cycle period of source oscillator 8010 is 4 $\mu$sec and a required refresh period is 16 $\mu$sec or shorter. Then, programmable counter 8100 may divide the output frequency from source oscillator 8010 by 4.

In this way, the preset value supplied to programmable counter 8100 is varied in order to change the oscillation cycle period of reference clock Ref.Clk supplied from self-refresh timer 8000. However, a problem here is that this control is too coarse as detailed below.

Specifically, if any process variations cause the oscillation cycle period of source oscillator 8010 to be longer than a designed period, the divisor should be decreased to 3 for example in order to maintain the refresh period of 16 $\mu$sec or shorter. Otherwise, the self-refresh cycle period is too long in terms of data holding characteristics of memory cells.

However, if the clock frequency of source oscillator 8010 having the oscillation cycle period which is somewhat longer than 4 $\mu$sec is divided by 3 as described above, the refresh cycle period would be 12 $\mu$sec or somewhat longer. In other words, in spite of the designed self-refresh cycle period of 16 $\mu$sec, the refresh frequency is four-thirds (4/3) of the required frequency.

On the other hand, if the oscillation cycle period of source oscillator 8010 becomes shorter than the designed period, the oscillation cycle period should be 16 $\mu$sec/5, namely, 3.2

μsec, or shorter. Otherwise, the divisor cannot be increased in terms of data holding characteristics mentioned above and consequently, the refresh frequency increases.

A resultant problem is thus increase in the amount of current consumed for data retention, in both of the situations in which the oscillation cycle period of source oscillator 8010 is longer and shorter respectively.

SUMMARY OF THE INVENTION

One object of the present invention is to provide a dynamic semiconductor memory device having a self-refresh timer tuned after a wafer process. A flexible tuning is possible under the influence of process variations occurring in the process for forming the self-refresh timer, and increase in the amount of current consumed for data retention can be avoided.

In summary, the present invention is a dynamic semiconductor memory device including a memory cell array, a memory cell selector circuit and a refresh control circuit.

The memory cell array includes a plurality of memory cells arranged in rows and columns. The memory cell selector circuit selects a memory cell to be refreshed in the memory cell array. The refresh control circuit supplies a first address signal to the memory cell selector circuit for a normal operation, the first address signal corresponding to an externally supplied address, and supplies a second address signal to the memory cell selector circuit for a refresh operation, the second address signal generated according to a refresh signal.

The refresh control circuit includes an oscillator circuit, a first storage circuit, a divider circuit, a second storage circuit, a first comparator circuit, and a divisor change circuit. The first storage circuit stores a first control value. The divider circuit divides an output from the oscillator circuit based on the first control value to generate the refresh signal. The second storage circuit stores a second control value. The first comparator circuit compares the second control value with the number of times an output from the divider circuit is activated. The divisor change circuit increases the first control value by a predetermined value according to an output from the first comparator circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
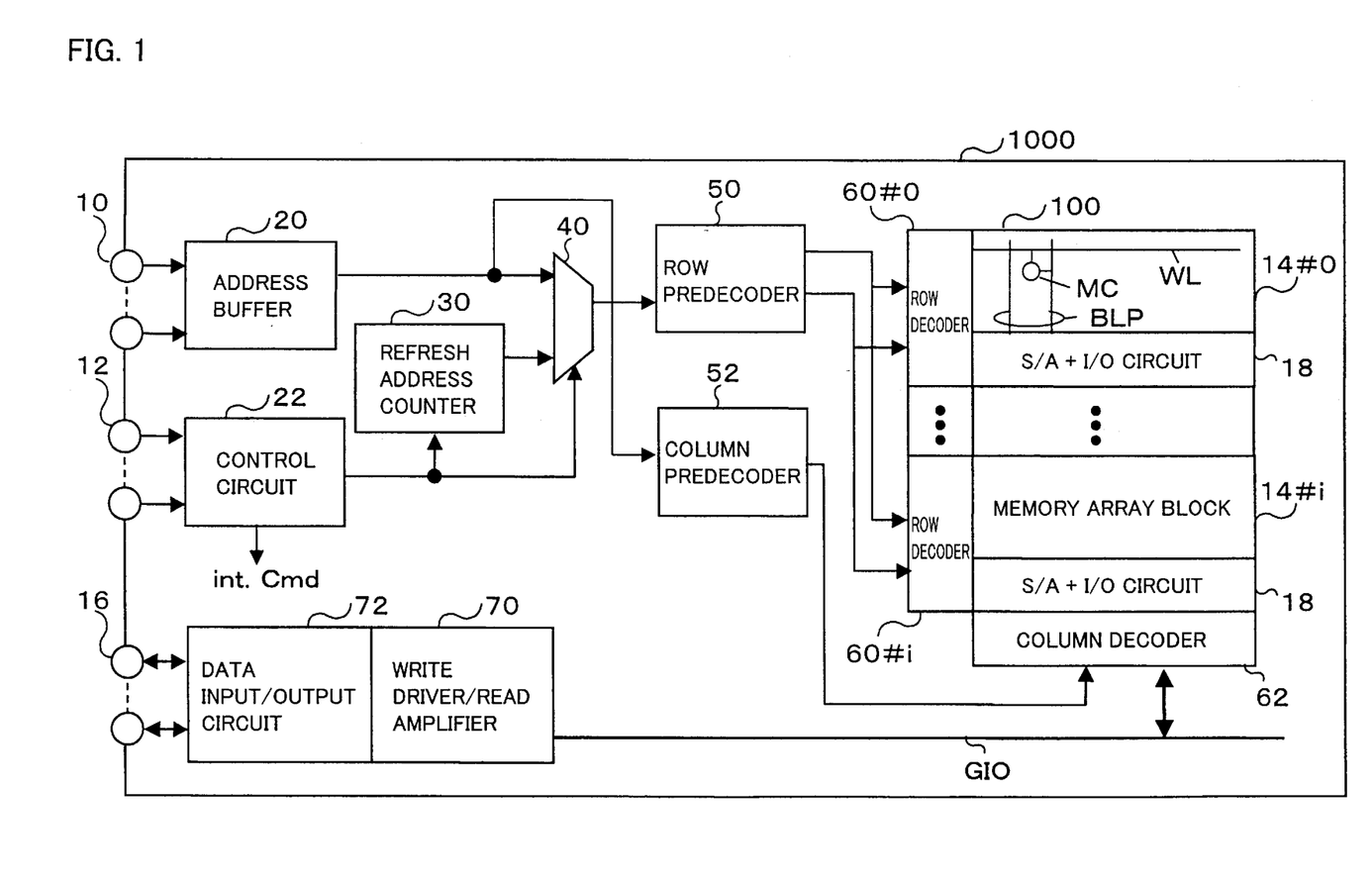
FIG. 1 is a schematic block diagram showing an entire structure of a DRAM 1000 according to a first embodiment of the present invention.

FIG. 1 is a schematic block diagram showing an entire structure of a DRAM 1000 according to a first embodiment of the present invention.

Referring to FIG. 1, DRAM 1000 includes an address buffer 20 receiving row and column address signals through a group of address signal input terminals 10. Address buffer 20 receives a row address to generate row-related predecode signals RA<0>–RA<j> (j: natural number) according to address signals A0–An. Address buffer 20 receives a column address to generate predecode signals CA<0>–CA<k> (k: natural number).

A control circuit 22 receives a signal from address buffer 20 as well as a command signal such as row address strobe signal /RAS, column address strobe signal /CAS and write enable signal /WE for example through a group of external control signal input terminals 12, and supplies internal control signal int.Comd for controlling an operation of each circuit in the DRAM.

DRAM 1000 further includes a memory cell array 100 having memory array blocks 14#0–14#i (i: natural number) each including a plurality of memory cells arranged in rows and columns.

In addition, DRAM 1000 includes a selector 40 receiving a signal from address buffer 20 and an output from a refresh address counter 30 to output one of them under control of control circuit 22, a row predecoder 50 receiving the output from selector 40 to generate a row predecode signal, and row decoders 60#0–60#i provided correspondingly to memory array blocks 14#0–14#i respectively for selecting a memory cell line (word line) in a corresponding memory block according to the row predecode signal and a block selection signal from row predecoder 50.

Memory array blocks 14#0–14#i each include memory cells MC arranged in rows and columns, a plurality of word lines WL provided correspondingly to the rows of memory cells MC, and bit line pairs BLP provided correspondingly to the columns of memory cells MC. Bit line pair BLP includes bit lines BL and /BL.

DRAM 1000 further includes a column predecoder 52 predecoding an internal column address signal supplied from address buffer 20, a column decoder 62 receiving a predecode signal from column predecoder 52 to generate a column selection signal, and a sense amplifier and I/O circuit 18 sensing and amplifying data in a memory cell connected to a selected row of memory array blocks 14#0–14#i to selectively output the data from memory cell array 100 according to the column selection signal.

A signal from a selected memory cell is read from memory cell array 100 onto a global IO line GIO, or data may be written from global IO line GIO into a selected memory cell in memory cell array 100.

A GIO line write driver/read amplifier 70 reads data transmitted by global IO line GIO or drives the potential level of global IO line GIO for writing data onto global IO line GIO.

In addition, GIO line write driver/read amplifier 70 outputs data read from memory cell array 100 to the outside of DRAM 1000 via a data input/output circuit 72. GIO line write driver/read amplifier 70 receives, via data input/output circuit 72, data DQ<0:n> supplied from the outside to data input/output terminal group 16 to drive the potential level of global IO line GIO according to data DQ<0:n>.

[Structure for Self-Refresh Operation]

Figure 2:
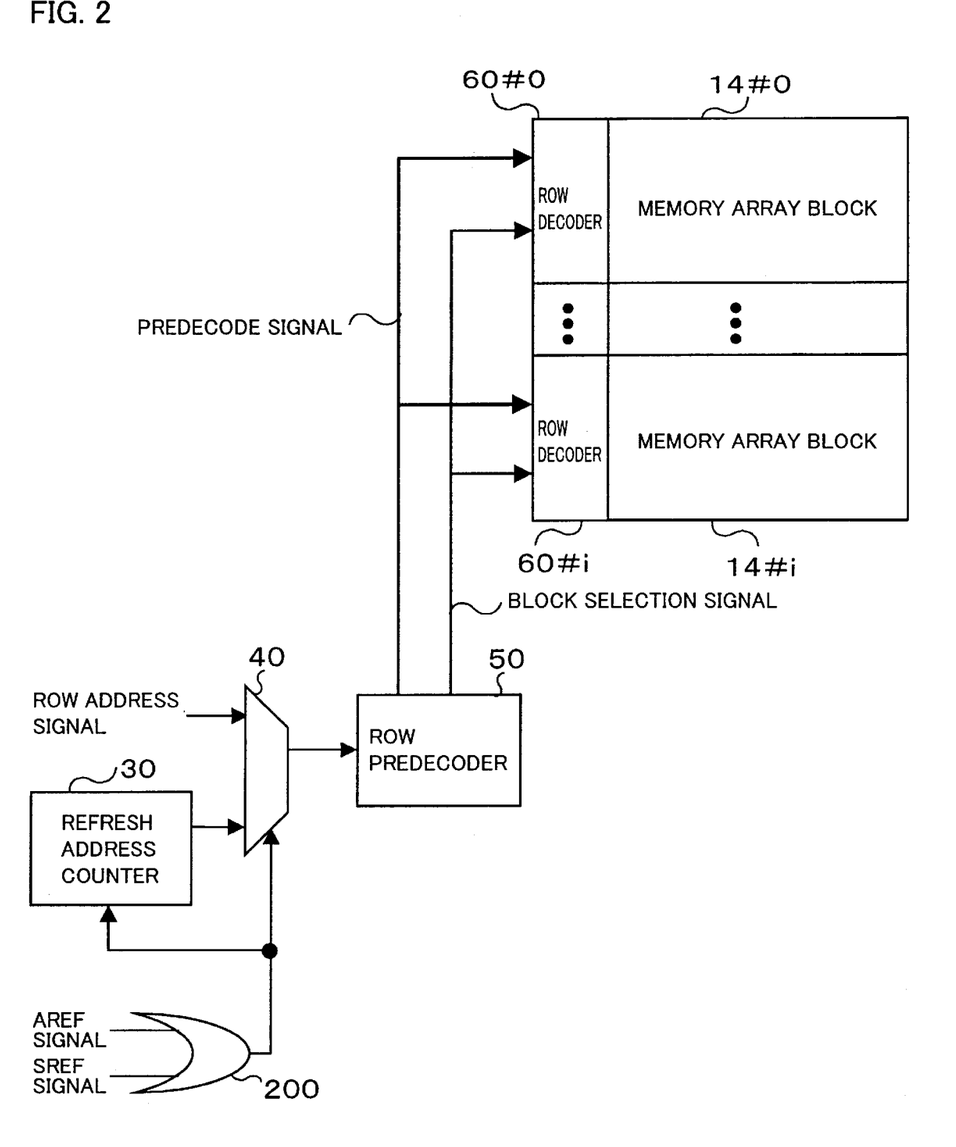
FIG. 2 is a schematic block diagram showing circuitry included in the structure of DRAM 1000 shown in FIG. 1 that is involved in row selection.

FIG. 2 is a schematic block diagram showing circuitry involved in row selection that is included in the structure of DRAM 1000.

As described in conjunction with FIG. 1, row decoders 60#0–60#i are provided correspondingly to memory array blocks 14#0–14#i respectively for driving word lines of the blocks. Row decoders 60#0–60#i each receive a predecode signal and a block selection signal from row predecoder 50.

The predecode signal is commonly supplied to row decoders 60#0–60#i that is used for designating one of the word lines included in one row decoder. Row decoders 60#0–60#i respectively receive sets of the block selection signals which vary from one row decoder to another row decoder. This block selection signal is supplied for selecting one row decoder 60#m (m: nonnegative integer, 0≦m≦i) from row decoders 60#0–60#i.

The predecode signal and block selection signal are generated by row predecoder 50 receiving a binary row address.

For a normal access, the binary row address supplied to row predecoder 50 is externally provided via address buffer 20. When a self-refresh or auto-refresh operation is designated, selector 40 selects an output from refresh address counter 30 and supplies the output to row predecoder 50.

The self-refresh operation is designated by self-refresh signal SREF generated by control circuit 22 according to a combination of external control signals. The auto-refresh operation is designated by activation of auto-refresh signal AREF generated by control circuit 22 according to a combination of external control signals.

Refresh address counter 30 and selector 40 receive an output from an OR circuit 200 which receives auto-refresh signal AREF and self-refresh signal SREF. OR circuit 200 is provided within control circuit 22. When the self-refresh mode is designated, for example, an output from refresh address counter 30 is incremented by one each time self-refresh signal SREF is activated, and the output is selected by selector 40 to be supplied to row predecoder 50.

Figure 3:
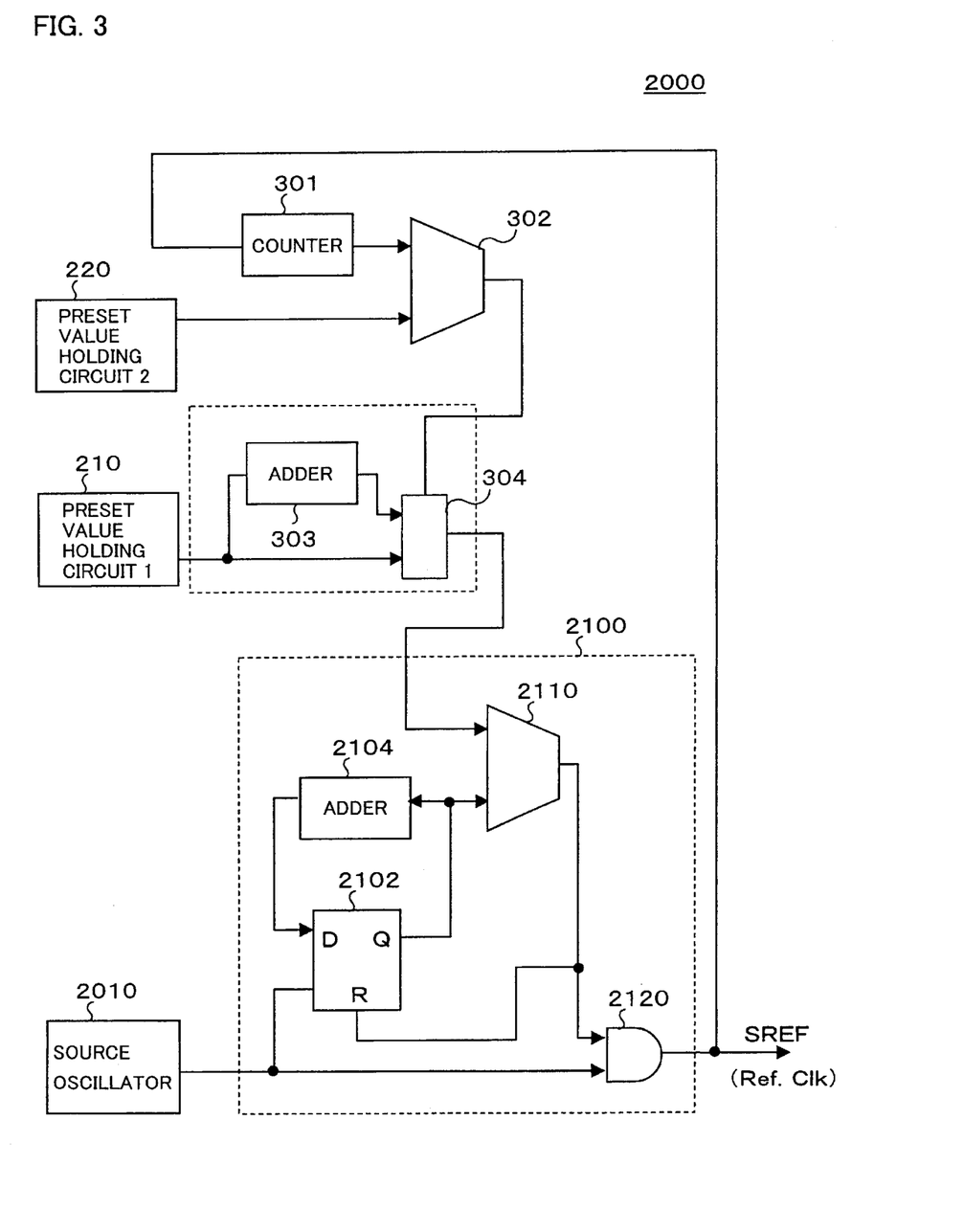
FIG. 3 is a schematic block diagram showing a structure of a self-refresh timer 2000.

FIG. 3 is a schematic block diagram showing a structure of a self-refresh timer 2000 for generating self-refresh signal SREF shown in FIG. 2. Self-refresh timer 2000 is also provided within control circuit 22.

Referring to FIG. 3, self-refresh timer 2000 includes an N-bit counter 301 with its output counted up at a rising edge of output signal SREF from self-refresh timer 2000, a preset value holding circuit 220 holding a preset value of N-bit width, a comparator 302 comparing an N-bit output from counter 301 with the preset value of N-bit width held by preset value holding circuit 220, a preset value holding circuit 210 holding preset value PDV defined as an output cycle period of refresh timer 2000, an adder 303 for incrementing preset value PDV by one, and a selector circuit 304 receiving the output from adder 303 and preset value PDV to output one of them according to an output from comparator 302. Here, the preset values held respectively by preset value holding circuits 210 and 220 are not limited to specific values. For example, these values may be programmed after a wafer process by means of fuse elements, for example.

Self-refresh timer 2000 further includes a source oscillator 2010 composed of an inverter chain for example to perform a self-excited oscillation, and a divider 2100. Divider 2100 includes a flip-flop circuit 2102 having its input node D receiving N-bit data and providing the data to its output node Q according to an output from source oscillator 2010, an adder 2104 receiving the output from flip-flop circuit 2102, incrementing the output by one, and supplying the incremented output to input node D of flip-flop circuit 2102, a comparator 2110 having one input receiving the output from flip-flop circuit 2102 and the other input receiving the output from selector circuit 304 to output a comparison result, and an AND circuit 2120 receiving respective outputs from comparator 2110 and source oscillator 2010 to output signal SREF.

The output from AND circuit 2120 is supplied to counter 301. The output from comparator 2110 has H level in a certain cycle, and, in the following cycle, the output from flip-flop circuit 2102 is reset.

Figure 4:
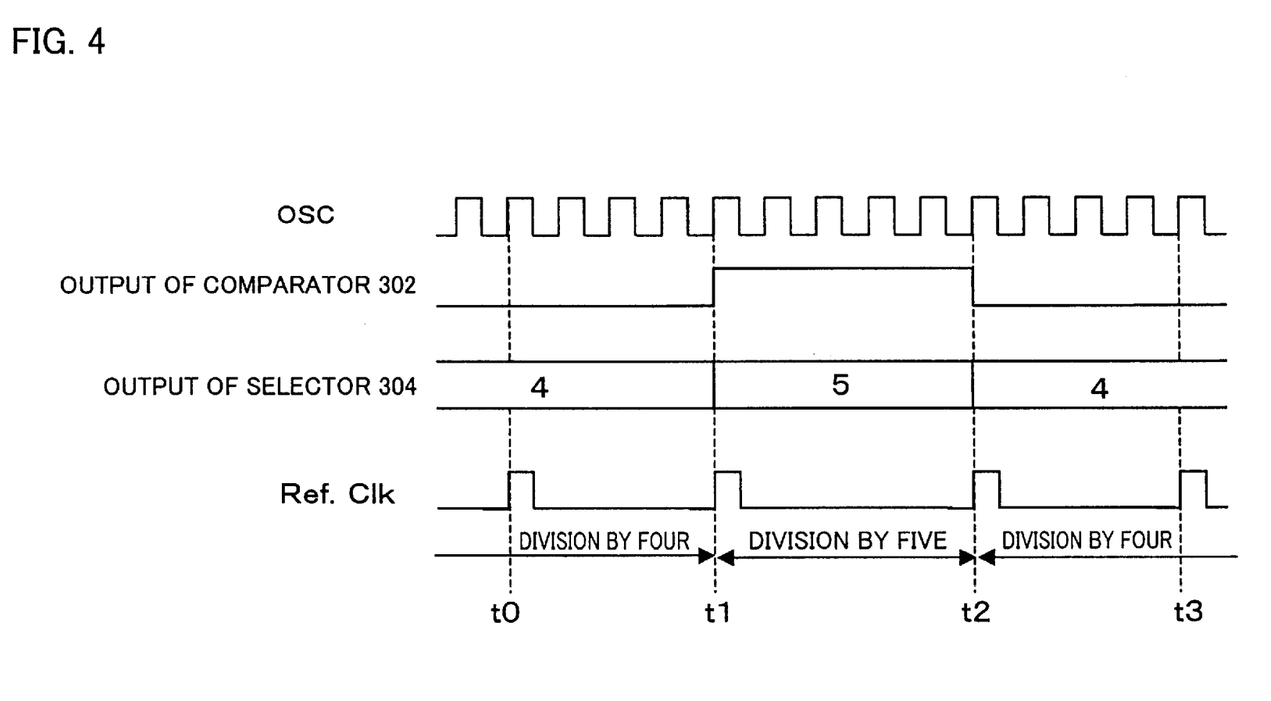
FIG. 4 is a timing chart illustrating an operation of self-refresh timer 2000 shown in FIG. 3.

FIG. 4 is a timing chart illustrating an operation of self-refresh timer 2000 shown in FIG. 3.

It is supposed here that a preset value of 2 is supplied to one input of comparator 302. Then, each time the output from counter 301 becomes 2, comparator 302 provides an output of H level so that selector 304 supplies an output from adder 303 to one input node of comparator 2110.

It is further supposed that preset value PDV is 4.

Referring to FIG. 4, at time t0, preset value PDV is selected by selector 304 to be supplied to one input node of comparator 2110. Suppose that AND circuit 2120 provides an output of H level at this time.

Accordingly, the level of flip-flop circuit 2102 is reset. The number of times source oscillator 2010 is activated is counted again by flip-flop circuit 2102 and adder 2104. At time t1 after 4 clocks from time t0 when signal SREF enters an active state, flip-flop circuit 2102 provides an output of 4 again so that the output from comparator 2110 becomes H level and signal SREF in an active state is output from AND circuit 2120.

Accordingly, the count value, namely the output level of counter 301 becomes 2 according to activation of signal SREF at time t0 and time t1. In other words, the output level is equal to the preset value supplied to comparator 302. Then, comparator 302 provides an output of H level and selector 304 selects and outputs an output from adder 303. Thus, after time t1, one input of comparator 2110 receives "5" determined by adder 303 by adding one to preset value PDV.

Accordingly, when the number of times source oscillator 2010 is activated is counted until a counter constituted of flip-flop circuit 2102 and adder 2104 supplies an output of 5, comparator 2110 supplies an output of H level so that a signal of active level is output from AND circuit 2120 at time t2.

Comparator 302 thus provides an output of L level and the output from counter 301 is reset. Then, selector 304 selects preset value PDV (4) again and supplies it to one input node of comparator 2110.

Therefore, the period between time t2 and time t3 when signal SREF enters an active state again corresponds to four cycle periods of oscillation of source oscillator 2010.

By such a structure, signal SREF is activated, on the basis of the cycle period of source oscillator 2010, alternately per four and five cycle periods. The four and five cycle periods each may be repeated a predetermined number of times. The timer thus provides an output once per a period, the period determined by dividing the output from the source oscillator by an average of four corresponding to preset value PDV and five.

It is noted that preset value PDV supplied to programmable counter 2100 and the preset value supplied to comparator 302 can be set by blowing fuses simultaneously with programming of a redundant circuit of DRAM 1000, for example.

Second Embodiment

In the structure of the first embodiment shown in FIGS. 2 and 3, refresh address counter 30 and self-refresh timer 2000 are provided separately.

Since refresh address counter 30 and self-refresh timer 2000 each include a counter for example, they may share the counter.

Figure 5:
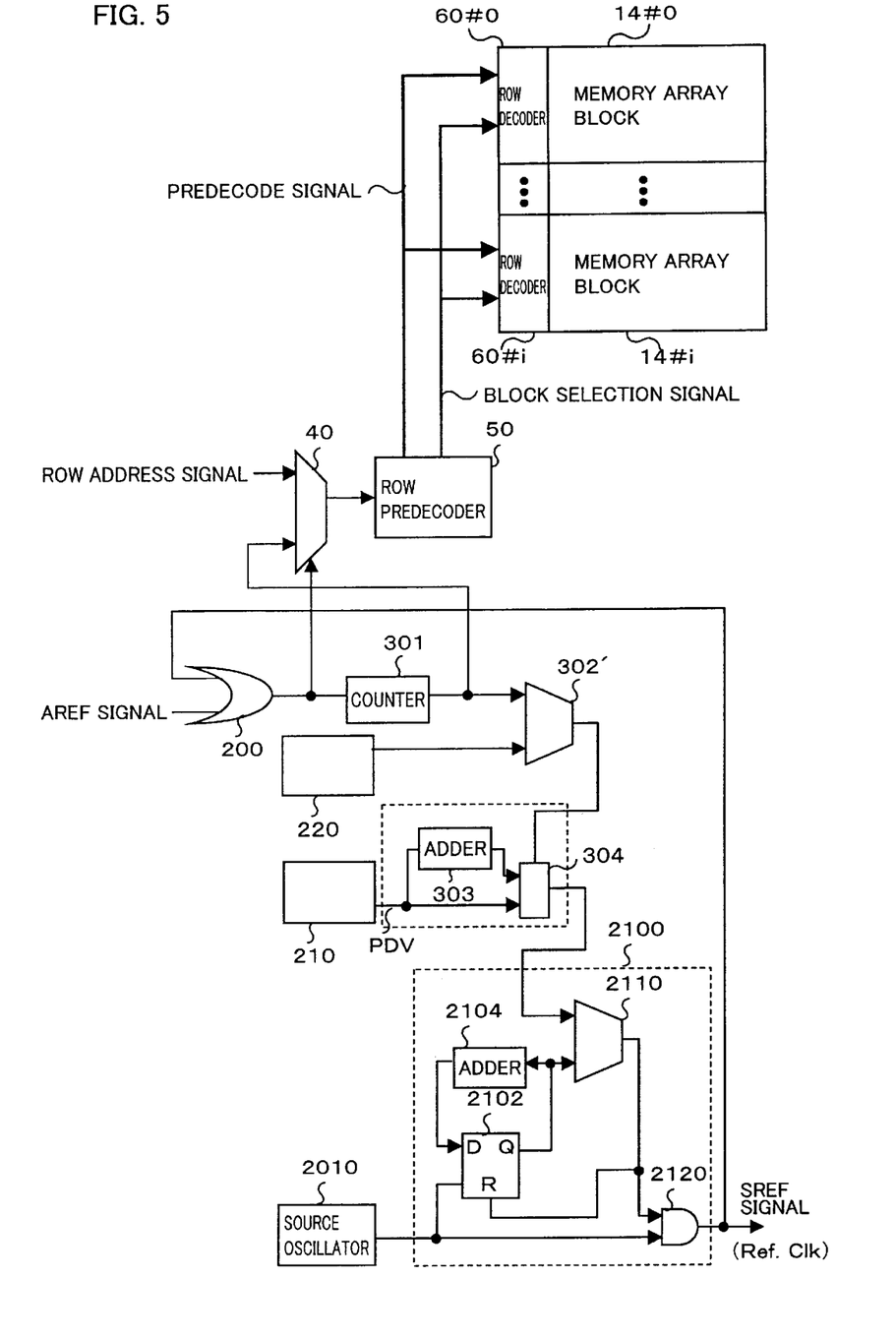
FIG. 5 is a schematic block diagram presented for describing a structure where a refresh address counter and self-refresh timer 2000 share a counter.

FIG. 5 is a schematic block diagram presented for describing a structure where the refresh address counter and self-refresh timer 2000 share a counter circuit.

Referring to FIG. 5, a counter 301 which further operates as a refresh address counter increments the level of an output from an OR circuit 200 receiving auto-refresh signal AREF or signal SREF from a programmable counter 2100.

Counter 301 provides its output not only to a comparator 302' but also to a selector 40 having its one input receiving an externally supplied row address and the other input, the output from counter 301 being provided specifically to the other input of selector 40. Accordingly, selector 40 provides the output from counter 301 to a row predecoder 50 if signal AREF or signal SREF is active.

Comparator 302' does not simply compare the output from counter 301 with a preset value supplied from a preset value holding circuit 220 to determine which of the output and preset value is greater. Specifically, comparator 302' determines whether the output from counter 301 can be divided by the preset value from preset value holding circuit 220 without remainder.

In this way, finer control of the self-refresh cycle period is possible while the circuit area is prevented from increasing.

Third Embodiment

According to the first and second embodiments, comparator 302 makes a comparison on the basis of the output from counter 301, the output including bits ordered from the least significant bit to the most significant bit. According to a third embodiment, comparator 302 makes a comparison on the basis of the counter output including bits from the least significant bit to the most significant bit that are at least partially transposed.

Figure 6:
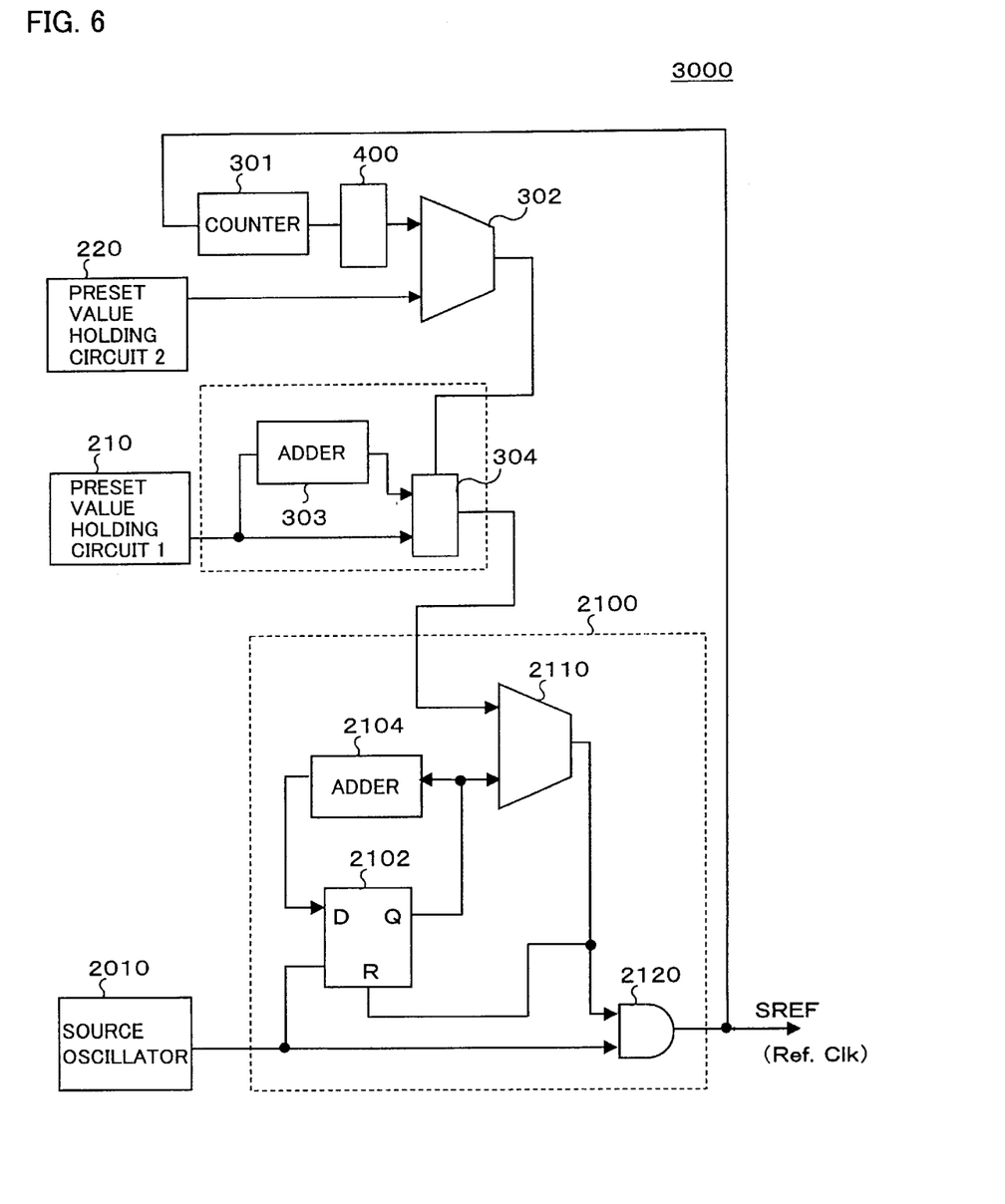
FIG. 6 is a schematic block diagram showing a structure of a self-refresh timer 3000 for transposing bits.

FIG. 6 is a schematic block diagram showing a structure of a self-refresh timer 3000 where such a transposition of bits is made. FIG. 6 is to be compared with FIG. 3.

The structure of self-refresh timer 3000 in FIG. 6 differs from that of self-refresh timer 2000 in FIG. 3 in that the former includes a bit transform circuit 400 which changes the order of bits of an output from counter 301, namely transposes the output bits, and supplies the transposed output bits to comparator 302. Other components of the structure of self-refresh timer 3000 are similar to those of self-refresh timer 2000, therefore, the same components are denoted by the same reference character and description thereof is not repeated.

Referring to FIG. 6, for example, the order of bits from the most significant bit to the least significant bit in an output from counter 301 is inverted by bit transform circuit 400. Then, comparator 302 makes a comparison on the basis of the inversely-ordered bits. Here, preset value holding circuit 220 holds a preset value of "3"="011".

Then, when the output from counter 301 increases from "000" to "111" each incremented successively by 1, a resultant signal having inversely-ordered bits changes in the manner: "000"→"100"→"010"→ "110"→"001"→"101"→"011"→"111".

At this time, comparator 302 makes a comparison between an output value from bit transform circuit 400 that includes inversely-ordered bits as described above, and preset value "3".

If a simple comparison is made between the output from counter 301 and preset value "3", comparator 302 provides an output of L level in the period in which the output from counter 301 changes from "000" to "011". In the period in which the output from counter 301 changes from "100" to "111", comparator 302 provides an output of H level.

On the other hand, if a comparison is made based on the transposed bits of the counter output, results of the comparison providing H level and results thereof providing L level are mixed and dispersed. Accordingly, selection of a value greater by 1 relative to preset value PDV occurs irregularly or dispersedly. Then, the cycle period of a refresh operation changes irregularly or dispersedly so that peaks of operating current can be scattered by the refresh operation.

According to the description above, bit transform circuit 400 is structured to invert the order of bits from the most significant bit to the least significant bit included in the output from counter 301. However, the present invention is not limited to such a structure. Specifically, bit transform circuit 400 may at least partially transpose bits from the most significant bit to the least significant bits included in the output from counter 301 in order to use the transposed bits for a comparison by comparator 302.

It is possible for the second embodiment to include a similar bit transform circuit 400 by which bits from the least significant bit to the most significant bit of an output from counter 301 are at least partially transposed for comparison by comparator 302.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device comprising:
  a memory cell array including a plurality of memory cells arranged in rows and columns;
  a memory cell selector circuit selecting a memory cell to be refreshed in said memory cell array; and
  a refresh control circuit supplying a first address signal to said memory cell selector circuit for a normal operation, said first address signal corresponding to an externally supplied address, and supplying a second address signal to said memory cell selector circuit for a refresh operation, said second address signal generated according to a refresh signal,
  said refresh control circuit including
    an oscillator circuit,
    a first storage circuit storing a first control value,
    a divider circuit dividing an output frequency from said oscillator circuit based on said first control value to generate said refresh signal,
    a second storage circuit storing a second control value,
    a first comparator circuit comparing said second control value with the number of times an output from said divider circuit is activated, and
    a divisor change circuit increasing said first control value by a predetermined value according to an output from said first comparator circuit.

2. The dynamic semiconductor memory device according to claim 1, wherein
said divisor change circuit includes
an adder receiving an output from said first storage circuit to increase the output by a predetermined value and
a first selector circuit receiving an output from said adder and the output from said first storage circuit to supply to said divider circuit, according to activation of the output from said first comparator circuit, the output from said adder as said first control value instead of the output from said first storage circuit.

3. The dynamic semiconductor memory device according to claim 1, wherein
said divider circuit includes
a counter circuit counting the output from said oscillator circuit,
a second comparator circuit comparing said first control value with an output from said counter circuit and
a gate circuit receiving the output from said oscillator circuit to supply the output as said refresh signal according to activation of an output from said second comparator circuit.

4. The dynamic semiconductor memory device according to claim 1, wherein
said refresh control circuit further includes a counter circuit counting said refresh signal to generate said second address signal in said refresh operation and supplying a resultant count to said first comparator circuit.

5. The dynamic semiconductor memory device according to claim 1, wherein
said refresh control circuit includes
a counter circuit counting said refresh signal and
a bit transform circuit transposing bits of an output from said counter circuit to supply the output having the transposed bits to said first comparator circuit.

* * * * *